United States Patent
Andresen

[19]
[11] Patent Number: 5,808,478
[45] Date of Patent: Sep. 15, 1998

[54] DIGITALLY CONTROLLED OUTPUT BUFFER TO INCREMENTALLY MATCH LINE IMPEDANCE AND MAINTAIN SLEW RATE INDEPENDENT OF CAPACITIVE OUTPUT LOADING

[75] Inventor: Bernhard Hans Andresen, Dallas, Tex.

[73] Assignee: Texas Instruments Incorporated, Dallas, Tex.

[21] Appl. No.: 804,020

[22] Filed: Feb. 21, 1997

Related U.S. Application Data

[62] Division of Ser. No. 415,269, Apr. 3, 1995, Pat. No. 5,621,335.

[51] Int. Cl.[6] .............................. H03K 19/00; G06M 3/00
[52] U.S. Cl. .................................. 326/31; 326/30; 326/86; 377/45; 377/55
[58] Field of Search .................................. 326/30, 83, 86, 326/31–34, 21, 87; 327/108, 170; 377/45, 55–56

[56] References Cited

U.S. PATENT DOCUMENTS

| | | | |
|---|---|---|---|
| 4,698,828 | 10/1987 | Hiramoto | 377/45 |
| 4,815,113 | 3/1989 | Ludwig et al. | 377/39 |
| 4,939,389 | 7/1990 | Cox et al. | 326/86 |
| 4,979,194 | 12/1990 | Kawano | 377/55 |
| 5,134,311 | 7/1992 | Biber et al. | 326/30 |
| 5,194,765 | 3/1993 | Dunlop et al. | 326/87 |
| 5,220,208 | 6/1993 | Schenck . | |
| 5,254,883 | 10/1993 | Horowitz et al. | 326/30 |
| 5,422,608 | 6/1995 | Levesque | 333/17.3 |
| 5,521,952 | 5/1996 | Morishima | 377/55 |

OTHER PUBLICATIONS

Mano *Computer Engineering: Hardware Design*. Prentice Hall, NJ. 1988. pp. 124–126.

*Primary Examiner*—Edward P. Westin
*Assistant Examiner*—Jon Santamauro
*Attorney, Agent, or Firm*—Robby T. Holland; James C. Kesterson; Richard L. Donaldson

[57] ABSTRACT

An output buffer with a slew rate that is load independent is comprised of an output buffer (14) that is connected to an output terminal (12). The output buffer (14) is controlled such that it can drive a load (18) with different drive levels by changing the transconductance internal thereto. The transition on the input to the buffer (14) is passed through an intrinsic delay block (34) and variable delay block (40) to provide a delay signal on a node (42). A first phase detector latch (50) with a first threshold voltage compares this transition with the transition on the output terminal (12). A second phase detector latch (60) with a second threshold voltage, also compares this delayed transition with that on the output terminal (12). If both of the latches (50) and (60) indicate that the delayed transition occurred after the transition on the output terminal (12), a control signal on a line (78) is changed by incrementing a counter (74). This will increase the drive to a load (18). If the transition on the output terminal (12) occurs after the delayed transition, then the counter (74) increments the count value in the opposite direction, increasing the drive to the load (18) to increase the speed of the output driver (14).

4 Claims, 3 Drawing Sheets

DIGITALLY CONTROLLED OUTPUT BUFFER TO INCREMENTALLY MATCH LINE IMPEDANCE AND MAINTAIN SLEW RATE INDEPENDENT OF CAPACITIVE OUTPUT LOADING

This is a division, of application Ser. No. 08/415,269, filed Apr. 3, 1995, now U.S. Pat. No. 5,621,335.

TECHNICAL FIELD OF THE INVENTION

The present invention pertains in general to output buffers and, more particularly, to an output buffer with a control system that varies the slew rate as a function of the output loading or matching the output drive to a transmission line load.

CROSS REFERENCE TO RELATED APPLICATION

This application is related to U.S. Pat. No. 5,220,208, entitled "Circuitry and Method for Controlling Current in an Electronic Circuit", issued Jun. 15, 1993 to the present assignee.

BACKGROUND OF THE INVENTION

Advancement in the integrated circuit technology has led to vast improvements in the speed of integrated circuits. Increasing integrated circuit speeds has resulted in faster rise and fall times of output voltages in response to new inputs generating more system switching noise. Controlling output edge rates and impedances is required to minimize this noise when transmitting data at high rates. The output characteristics are a function of a number of factors, one important factor being the actual load presented to an output terminal. Other factors that affect output characteristics are temperature variations, process variations and voltage variations.

Such things as temperature variations, process variations and voltage variations are internal parameters that can be compensated. One technique for accounting for some of these variations can be found in U.S. Pat. No. 5,220,208, which is incorporated herein by reference. The '208 patent discloses a system that utilizes a time reference and a delay string through which a signal is propagated. The time reference allows accurate measurement of the propagation distance of the signal through the delay string and thus, provides a benchmark by which to judge internal variations. These can then be accounted for. However, this type of system does not provide any information as to the variations associated with different output loads. Some systems that have addressed the problems of variations of the output characteristics as a function of load have utilized constant current sources and some type of analog circuitry to solve this problem. However, these type of systems typically require a higher power drain due to the use of the constant current sources and analog circuitry fabricated on the integrated circuit. With most CMOS systems, this is difficult to implement and may require the use of BiCMOS technology in order to realize these functions.

Therefore, it may be seen that a need has arisen for a method and apparatus for controlling the output as a function of load such that it can be maintained within acceptable limits independent of load.

SUMMARY OF THE INVENTION

The present invention disclosed and claimed herein comprises an output buffer with load independent slew rate when driving capacitive loads and output impedance matching line impedance when driving transmission line loads. The output buffer includes internal thereto a variable drive level buffer having an input and an output. The output is operable to drive a load at a variable drive level set by the value of a drive control signal that is input on a drive control input to the variable drive level buffer. A compensated delay interval is provided between an input logic transition on the input and a resulting output logic transition on the output. After the delay interval, a window comparator then compares the actual output voltage level with the desired voltage level to determine the difference therebetween. A control system is operable to generate the drive control signal at a value to vary the drive level of the variable drive level buffer to reduce the difference between the actual and desired voltage levels.

In another aspect of the present invention, the variable drive level buffer comprises a transconductance device comprised of at least one fixed MOS inverter circuit and a plurality of three-state MOS inverter circuits. Each of the three-state MOS inverter circuits operates in a first isolation mode in response to a first value of the drive control signal, and in a conducting mode in response to a second and different value of the drive control signal. The three-state MOS inverter circuits are disposed in parallel with the fixed MOS inverter circuit with the drive control circuit operable to change select ones of the three-state MOS inverter circuits from the first isolation mode and the conducting mode.

An advantage of the present invention is provided in that the drive level of an output buffer can be varied as a function of the load such that the slew rate can be made capacitive load independent and the output impedance can be made to match a driven transmission line.

Another advantage of the present invention is that the output buffer can incorporate a variable transconductance device, the drive level thereof varied without the use of current sources to vary the drive provided to the load.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
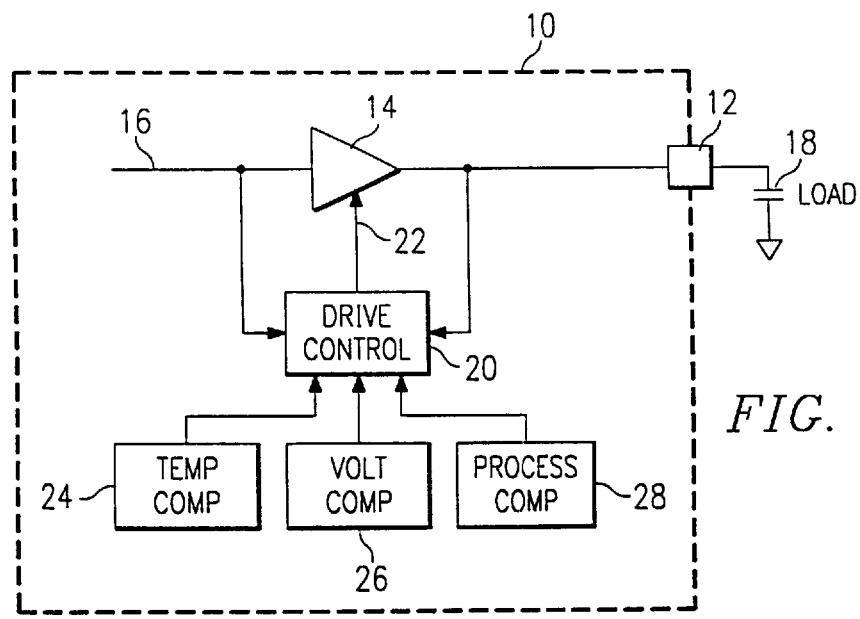
FIG. 1 illustrates an overall block diagram of the present invention.

Referring now to FIG. 1, there is illustrated an overall block diagram of the system of the present invention. An integrated circuit 10 is illustrated, the integrated circuit 10 having a plurality of output terminals 12, only one of which is shown. An output buffer 14 has the output thereof connected to the output terminal 12 and the input thereof connected to an input node 16. The output terminal 12 is connected to an external capacitive load 18, this external capacitive load 18 varying as a function of the use of the output buffer 14 and the integrated circuit 10, this load 18 typically varying over a wide range of, for example, 10 pf–100 pf Alternately, the driven load could be a transmission line with the impedance thereof varying over a wide range, typically 40–160 ohms. The following description will first cover capacitive loadings and then transmission lines.

The output buffer 14 is operable to drive the load 18 with a variable driving impedance, such that the slew rate on the output can be controlled when driving a capacitive load. This is done under the control of a drive control block 20, which receives as inputs, the output of the output buffer 14 and the input of the output buffer 14 on node 16. One drive control can service multiple outputs of the same type if they drive similar capacitive loads. A control output on a line 22 is provided to the output buffer 14. Drive control 20 is operable to compare a transition from a logic "0" to a logic "1" on the input node 16 and the resulting transition from a logic "0" to a logic "1" on the output of buffer 14 on the output terminal 12. There will be a difference in the times the two transitions occur, which differences are due to a number of factors. One of the factors is the intrinsic delay in the output buffer 14 from the presentation of the signal on node 16 until the voltage on node 12 starts to change. This is something that cannot be changed. This intrinsic delay does change with temperature and voltage and also changes between integrated circuits as a function of process variations. However, one of the most difficult factors to account for is that due to the various values of the load 18 on the output terminal 12. The drive control 20 accounts for these. Additionally, the drive control 20 accounts for temperature variations, voltage variations and process variations, these being accounted for through various input blocks 24, 26 and 28 to provide for temperature compensation, voltage compensation and process variations, respectively. As will be described in more detail hereinbelow with respect to a capacitive load, the drive control 20 will compare the transition at the input and the transition at the output of the buffer 14 and adjust the drive level of the buffer 14 to vary current drive to the load 18. This will effectively vary the slew rate such that, when the capacitive load is increased, a lower impedance is presented to drive more current into the load and, when the capacitive load is decreased, the driving impedance is increased to drive less current into the load. With respect to a transmission line load, the voltage level on the output is measured during the flight time and prior to the reflected signal returning from a remote termination.

Figure 2:
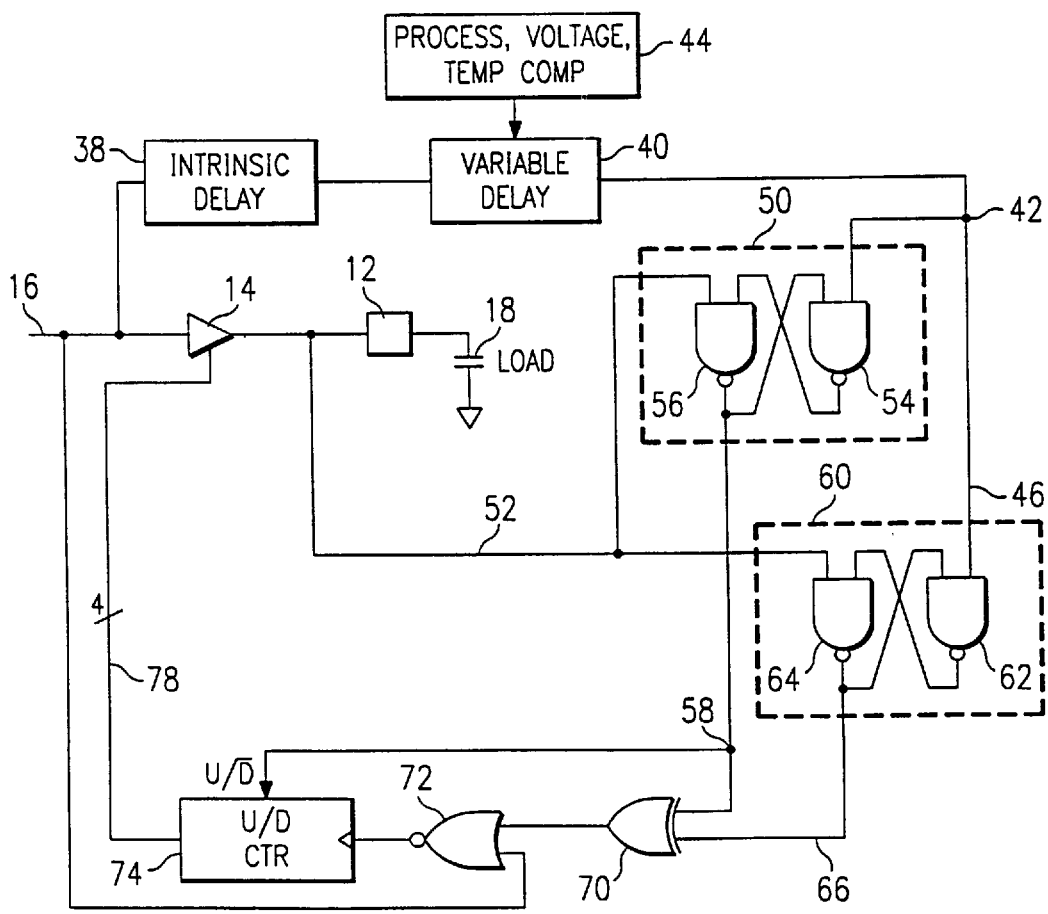
FIG. 2 illustrates a more detailed block diagram of the present invention.

Referring now to FIG. 2, there is illustrated a detailed block diagram of the system of the present invention. The transition on the input line 16 is input to a delay block 38, which introduces an amount of delay tracking the overall intrinsic delay associated with the output buffer 14 and various other components that are associated with the operation. These delays being delays that are set as a result of processing the overall circuit, operating voltage and temperature, which are common between blocks 38 and 14. The output of the intrinsic delay block 38 is input to a variable delay block 40, which variable delay block 40 is operable to selectively introduce a determined amount of delay into the delay path which does not vary with process, voltage and temperature conditions. This delay is equal to the time required for the output to reach ½ the final state level at the desired slew rate. The output of the variable delay is connected to a delay node 42. The variable delay 40 has the delay thereof set in accordance with an algorithm contained within a block 44 which is operable to account for various process variations, voltage variations and temperature variations. The technique utilized for this is disclosed in U.S. Pat. No. 5,220,208, which is incorporated herein by reference. In general, this system utilizes a time reference and a delay string of a finite length. The delay string has a plurality of taps which can be decoded to determine how far down the delay string a transition traveled prior to a time event terminating. This decoded output will then be utilized to set a variable delay value in block 40.

The transition on the delay node 42 is input to one side of a cross-coupled latch 50, the other side thereof connected to terminal 12. Latch 50 is comprised of a NAND gate 54, having one input thereof connected the delay node 42, the other input thereof connected to the output of a NAND gate 56 and the output thereof connected to one input of a NAND gate 56. The NAND gate 56 has the other input thereof connected to the node 52 and the output thereof connected to an output node 58. NAND gate 56 compares its internal threshold voltage, the first threshold voltage, to the voltage level on the output terminal 12 when there is a logical "0" to "1" transition on delay node 42. The threshold of the NAND gate 56 input tied to terminal 12 is a value less than ½ the output voltage swing or about forty percent thereof. Similarly, delay node 42 is connected to the input of a cross-coupled latch 60 that is comprised of a NAND gate 62 and a NAND gate 64. NAND gate 62 has one input thereof connected to the delay node 42, the output thereof connected to one input of the NAND gate 64 and the other input thereof connected to the output of the NAND gate 64. NAND gate 64 has the other input thereof connected to terminal 12 and the output thereof connected to a node 66. Latch 60 compares its internal threshold voltage, the second threshold voltage, and the voltage level on the output terminal 12 when there is a logical "0" to "1" transition on delay node 42. The threshold of the NAND gate 64 input tied to terminal 12 is a value greater than ½ the output voltage swing or about sixty percent thereof.

The output of latches 50 and 60 on nodes 58 and 66, respectively, are input to respective inputs of a two input exclusive OR gate 70, the output thereof connected to one input of a NOR gate 72. NOR gate 72 has the output thereof connected to the clock input of an up/down counter 74, the other input of NOR gate 72 connected to the input line 16. Additionally, the control input of the up/down counter 74 is connected to the node 58, this determining in which direction the up/down counter 74 counts. The output of the counter 74 comprises a control input to the output buffer 14, this provided on a four line bus 78. Both NAND gates 56 and 64, in the preferred embodiment, are high gain to minimize metastability conditions.

In operation, the latch 50 has the output thereof set to either a logic "0" or a logic "1", depending upon whether the transition from a logic "0" to a voltage level exceeding the threshold of gate 56 (hereinafter "first transition") occurred at terminal 12 prior to occurring on delay node 42. If the first transition occurs on terminal 12 prior to the transition occurring on node 42, the latch 50 is set to a logic "0". This will introduce a logic "0" on one input of the exclusive OR gate 70 and also set the up/down counter 74 to count down. This situation occurs since the delay through the output buffer 14 driving load 18 to a voltage greater than the first threshold voltage is less than the delay through the intrinsic delay 38 and the variable delay 40, i.e., the output buffer 14 is faster due to a smaller load when a capacitive load is considered. Alternately, if the transition occurs on node 42 prior to the first transition occurring on terminal 12 for the situation wherein the output buffer 14 is slower, latch 50 will be set to a logic "1". However, the latch 50 does not determine whether the up/down counter 74 is incremented and, thus, the operation of the output buffer 14 changed. This depends upon the operation of the latch 60.

In operation, the latch 60 has the output thereof set to either a logic "0" or a logic "1" depending on whether the transition from a logic "0" to a voltage exceeding the input threshold of gate 64 (hereinafter "second transition") occurred at terminal 12 prior to occurring on delay node 42. The difference in threshold voltages between latch 50 and latch 60 forces the first transition to always occur before the second transition. The difference in timing is equal to the difference in threshold voltages divided by the output slew rate. The latch 60, as described above, compares the time of the second transition on terminal 12 and the time of occurrence of the transition on the delay node 42. If the second transition occurs on terminal 12 prior to the transition occurring on node 42, the output of latch 60 will be a logic "0". Alternatively, if the transition occurs first on node 42, the output of the latch 60 will be set to a logic "1".

For the condition where the first and second transitions on terminal 12 occur prior to the transition on node 42, both node 58 and node 66 will be set to a logic "0", this being determined to be an equality by the exclusive OR gate 70. This will cause the output of exclusive OR gate 70 to go high and force the output of the NOR gate 72 low, clocking the up/down counter 74. If the first and second transitions on terminal 12 occur after the transition on node 42, the logic state on both nodes 58 and 66 will be a logic "1", also incrementing the counter 74. However, in this condition, the logic "1" state on node 58 will set the up/down counter 74 in the "up" direction.

In the condition wherein the first transition occurs on terminal 12 after the transition occurs on node 42 but before the second transition occurs, this will result in a logic "1" state output on node 58 and a logic "0" state output on node 66. This will not result in a change in the output state on the exclusive OR gate 70 and, therefore, will not increment the counter 74. Therefore, the delay between the first and second transition points provides a "window" within which there will be no change. It is an aspect of the circuit of the present invention to change the drive provided by the output buffer 14 until the slew rate is within this window. If this window were not provided and the drive to the output buffer 14 were changed such that the slew rate were changed back and forth every cycle about a desired level, this would not cause an oscillation and would not be a problem. However, with the use of the window, an output characteristic which does not fluctuate between cycles can be provided.

Figure 3:
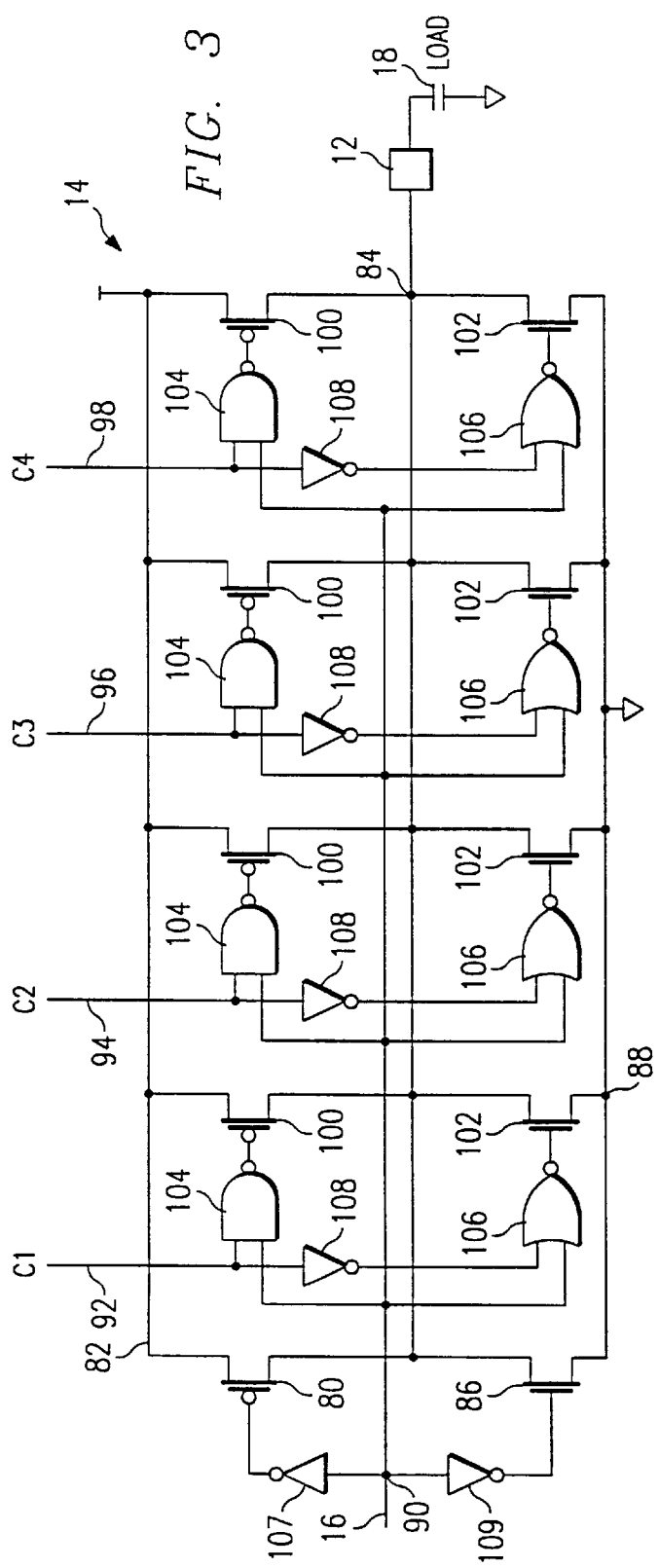
FIG. 3 illustrates a logic diagram of the output buffer.

Referring now to FIG. 3, there is illustrated a logic diagram for the output buffer 14. The output buffer 14 is comprised of a plurality of three-state gates and a standard gate. The standard gate is comprised of a P-channel transistor 80 having one side of the source/drain path thereof connected to a $V_{DD}$ node 82 and the other side thereof connected to an output node 84, which output node 84 is connected to the output terminal 12. An N-channel transistor 86 has the source/drain path thereof connected between the node 84 and a $V_{SS}$ node 88. The gates of the P-channel transistor 80 and the N-channel transistor 86 are connected to a common input node 90, which corresponds to the input node 16 through invertors 107 and 109, respectively. Invertors 107 and 109 have similar delay characteristics to NAND gate 104 and NOR gate 106, respectively.

In order to provide for the drive variability of the output buffer 14, a plurality of three-state gates are provided which are controlled by one of four control lines 92, 94, 96 and 98. Each of the three-state buffers is comprised of a P-channel transistor 100 having the source/drain path thereof connected between the $V_{DD}$ node 82 and the output node 84 and an N-channel transistor 102 having the source/drain path thereof connected between the output node 84 and the $V_{SS}$ node 88. The gate of the P-channel transistor is connected to the output of a NAND gate 104, one input thereof connected to the respective one of the control lines 9–98 and the other input thereof connected to the input node 90. The gate of the N-channel transistor 102 is connected to the output of a NOR gate 106, one input thereof connected to the input node 90, and the other input thereof connected to the output of an inverter 108, the input thereof connected to the respective one of the control lines 92–98. In operation, whenever the respective one of the control lines 92–98 is held low, the output of the associated one of the NAND gates 104 is a logic "high", pulling the gate of the associated P-channel transistor 100 high and the output of the associated NOR gate 106 low, also pulling the gate of the associated N-channel transistor 102 low. Therefore, when the associated control line 92-98 is at a low logic state, the associated P-channel transistor 100 and the associated N-channel transistor 102 are rendered non-conductive and, therefore, operate in an isolation state. When disposed in the opposite state, the control lines will allow the NAND gate 104 to pull the gate of the associated P-channel transistor 100 low when the signal on the input node 90 is low and pull the gate of the N-channel transistor 102 high, rendering it conductive.

The P-channel transistor 100 and N-channel transistor 102 for each of the three-state gates are sized to determine the transconductance of the respective transistor during operation thereof. These can be binary-weighted, such that each of the three-state buffers by itself and in any combination results in a different drive value. Therefore, a four-bit count value on the control lines 92–98 will result in different drive values depending upon the count value. The MSB of the counter 74 should control the highest drive 3-state buffer, and the LSB controls the lowest drive buffer.

Figure 4:
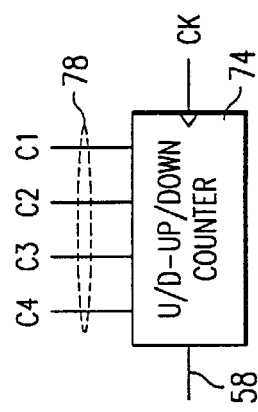
FIG. 4 illustrates a block diagram of the up/down counter.

Referring now to FIG. 4, there is illustrated a general block diagram of the up/down counter 74. The up/down counter 74 is a conventional design which receives the up/down direction control value on the node 58 to determine the direction if the count is to proceed. The counter is a four-bit counter providing the four control lines labeled C1, C2, C3 and C4 on the line 78 which are input to the control lines 92–98, respectively, on the output buffer 14 illustrated in FIG. 3. The counter 74 can be a conventional binary counter comprised of multiple flip-flops, or it can be as simple as a Johnson counter. The start count value is not important as the system will seek its own count value. However, a reset could be provided upon power up.

Figure 5:
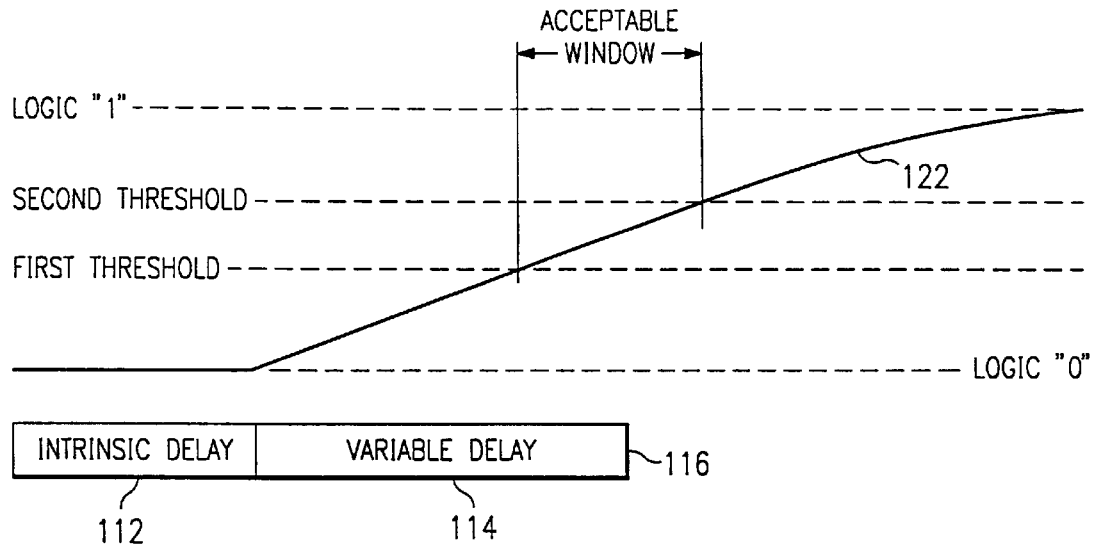
FIG. 5 illustrates a diagrammatic view of the delays as compared to the output signal when driving a capacitive load.

Referring now to FIG. 5, there is illustrated a diagrammatic view of the various delays and the relationship of the output transition thereto when driving a capacitive load. As described above, an intrinsic delay 112 is provided which is a delay provided by the delay block 38 in FIG. 2. This is a fixed value that accounts for the internal delays of the output buffer 14. A variable delay 114 is provided, which is provided by the delay block 40 and allows adjustment of the delay between the input to the delay block 38 and the delay node 42. This delay occurs at a boundary 116. This is a relative boundary at which the decision is made as to whether the drive provided by the output buffer 14 to the load 18 through the output terminal 12 is either too fast or too slow. If the second transition occurs prior to this time, an adjustment is made, and if the first transition occurs after this time, an adjustment may be made. A transition 122 is illustrated on an output pulse that goes from a logic "low" to a logic "high". This is depicted with the first transition occurring before the boundary 1 16, and the second transition after the boundary 116. This is an acceptable window and no incrementing of the counter 74 occurs when the transition 122 is so disposed. However, if the second transition occurs prior to the boundary 116, this indicates that the output buffer 14 is too fast and the counter value should be decremented. If the first transition occurs after the boundary 116, this indicates that the output buffer 14 is too slow and the count value should be incremented. Inserting another three-state buffer or a combination of the three-state buffers will result in a different drive to the load 18.

Driving an unterminated transmission line load differs from driving a capacitive load in that the load appears as a resistor equal to the characteristic impedance of the transmission line until the signal has propagated down the line, and the reflection is seen back at the output driver. The time required for the round trip of the signal is referred to as the "flight time", and the signal propagates at approximately six inches per ns. The magnitude of the original output voltage on the line is the product of the output current and the line impedance, and the reflected signal on an unterminated transmission line grows to twice that level. Unterminated transmission line drivers can be either incident wave or reflected wave types depending on whether the receiver's input threshold is crossed when the original signal arrives or when the reflected wave arrives. Incident wave drivers are faster because only ½ of the flight time is required to switch all inputs, whereas reflected wave drivers need the entire flight time to assure that all inputs have registered the transition. The input closest to the reflected wave output driver is the last to see the transition. For a given line impedance incident wave drivers require much higher current levels to generate the required output voltages, and the associated higher reflected voltages can cause severe system noise problems. The targeted application for this device is point-to-point driving of unterminated lines. Lowest system noise occurs when the output driver impedance matches the transmission line and the output voltage level during the "flight time" is ½ of the supply voltage. When this occurs, the reflected wave will bring the signal level up to that of the supply without undesirable overshoot.

Figure 6:
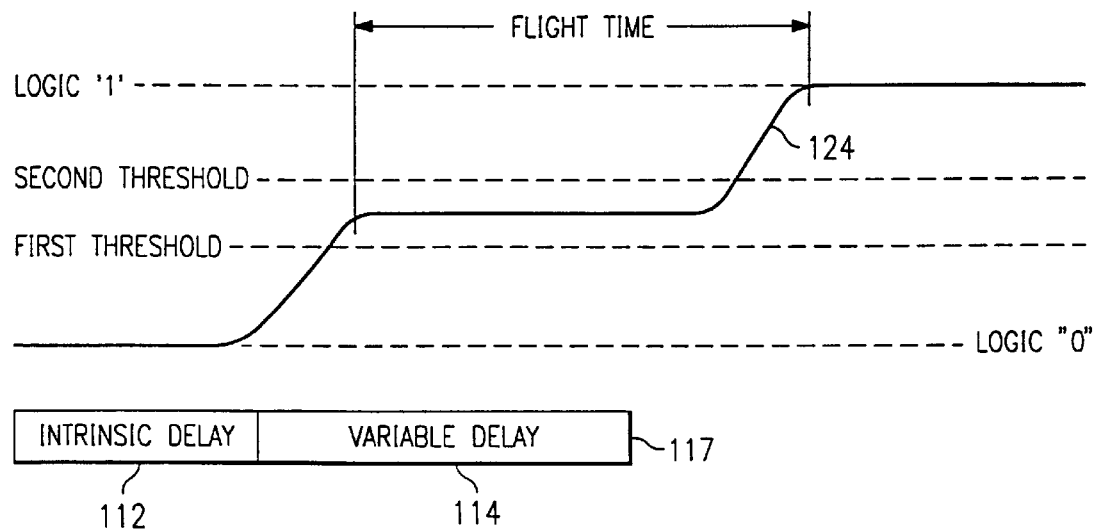
FIG. 6 illustrates a diagrammatic view of the delays as compared to driving a transmission line load.

Referring now to FIG. 6, there is a diagrammatic view of the various delays and the relationship of the output transition thereto when driving an unterminated transmission line in the reflected wave mode. As previously described, an intrinsic delay 112 is provided which is a delay provided by the delay block 38 in FIG. 2. This is a fixed value that accounts for the internal delay of the output buffer 14. A variable delay 114 is provided, which is provided by the delay block 40 and allows adjustment of the delay between the input to the delay block 38y and the delay node 42. This delay occurs at a boundary 117. This is a boundary at which the decision is made as to whether the drive provided by the output buffer 14 to the load 18 through the output terminal 12 is either too high or too low for minimum noise reflected wave switching. Variable delay 114 must be long enough to assure the output voltage has achieved a stable state and still be less than the "flight time". If the "flight time" is long enough to accommodate a range of delays in variable delay 114 then process, voltage and temperature compensation may not be required, thus reducing this function to a simple delay line. If the second transition occurs prior to boundary 117, an adjustment is made and, if the first transition occurs after this time, an adjustment is made. A transition 124 is illustrated on an output pulse that goes from a logic "0" to a logic "1" with a "flight time" equal to the round trip delay of the transmission line. This is depicted with the first transition occurring before the boundary 117, and the second transition after the boundary 117. This is an acceptable window and no incrementing of the counter 74 occurs when transition 124 is so disposed. However, if the first transition occurs after the boundary 117, this indicates the output buffer 14 drive is too low, and the counter value should be incremented. If the second transition occurs before the boundary 117, this indicates that the output buffer 14 drive is too high, and the count value should be decremented. Inserting another three-state buffer or a combination of the three-state buffers will result in a different drive to the load 18.

In summary, there has been provided an output buffer with internal circuitry for adjusting the drive provided to a load either to achieve a desired output slew rate that is independent of the value of the capacitive load or to match the impedance of a transmission line. In order to adjust the drive impedance of the output buffer, the transition at the input from a logic "low" to a logic "high" is compared to the voltage level on the output of the buffer after a suitable delay. If the voltage is below a predetermined threshold, this indicates that the output buffer is too slow and the drive current provided thereby is increased to the load until the delay is set to a desired value. If the voltage is above a desired threshold, the drive is decreased to increase the amount of delay.

Although the preferred embodiment has been described in detail, it should be understood that various changes, substitutions and alterations can be made therein without departing from the spirit and scope of the invention as defined by the appended claims.

What is claimed is:

1. A control circuit for driving a buffer, the control circuit comprising:
   a delay element for receiving a first input signal and generating a delayed signal;
   a first latch for receiving the delayed signal and also for receiving a second input signal;
   a second latch for receiving the delayed signal and also for receiving the second input signal;
   logic circuitry coupled to an output of the first latch and to an output of the second latch;
   a counter coupled to the output of the logic circuitry; and
   wherein the logic circuitry comprises an XOR gate and a NOR gate wherein the XOR gate receives the output of the first latch and the output of the second latch and the NOR gate receives an output of the XOR gate and the first input signal.

2. A control circuit for driving a buffer, the control circuit comprising:
   a delay element for receiving a first input signal and generating a delayed signal;
   a first latch for receiving the delayed signal and also for receiving a second input signal,
   a second latch for receiving the delayed signal and also for receiving the second input signal,
   logic circuitry coupled to an output of the first latch and to an output of the second latch;
   a counter coupled to the output of the logic circuitry; and
   wherein the counter comprises an up/down counter with a clock input for receiving the output of the logic circuitry and a count input for receiving the output of the first latch.

3. A control circuit for driving a buffer, the control circuit comprising:

a delay element for receiving a first input signal and generating a delayed signal;

a first latch for receiving the delayed signal and also for receiving a second input signal, a second latch for receiving the delayed signal and also for receiving the second input signal;

logic circuitry coupled to an output of the first latch and to an output of the second latch;

a counter coupled to the output of the logic circuitry; and wherein the delay element comprises a variable delay which is controlled by compensation circuitry.

4. A control circuit for driving a buffer, the control circuit comprising:

a delay element for receiving a first input signal and generating a delayed signal;

a first latch for receiving the delayed signal and also for receiving a second input signal, a second latch for receiving the delayed signal and also for receiving the second input signal:

logic circuitry coupled to an output of the first latch and to an output of the second latch;

a counter coupled to the output of the logic circuitry; and wherein the first input signal comprises the input of a buffer being driven and the second input signal the output of said buffer being driven.

* * * * *